United States Patent
Said

(10) Patent No.: US 7,796,689 B2
(45) Date of Patent: Sep. 14, 2010

(54) ADAPTIVE FILTER HAVING SHARED STRUCTURE

(75) Inventor: Ahmed M. Said, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 1091 days.

(21) Appl. No.: 11/321,733

(22) Filed: Dec. 29, 2005

(65) Prior Publication Data
US 2007/0160125 A1 Jul. 12, 2007

(51) Int. Cl.
*H03H 7/30* (2006.01)
(52) U.S. Cl. ...................................... 375/233
(58) Field of Classification Search .................. 375/232, 375/233, 346, 350; 708/322, 323
See application file for complete search history.

(56) References Cited

U.S. PATENT DOCUMENTS

| 5,642,382 | A | * | 6/1997 | Juan | 375/232 |
| 6,144,697 | A | * | 11/2000 | Gelfand et al. | 375/233 |
| 2001/0004384 | A1 | * | 6/2001 | Takanashi et al. | 375/229 |
| 2004/0120394 | A1 | * | 6/2004 | Miao et al. | 375/234 |
| 2006/0088091 | A1 | * | 4/2006 | Jeon et al. | 375/233 |
| 2007/0121717 | A1 | * | 5/2007 | Dong et al. | 375/232 |

* cited by examiner

*Primary Examiner*—Young T. Tse
(74) *Attorney, Agent, or Firm*—Trop, Pruner & Hu, P.C.

(57) ABSTRACT

An adaptive filter may include a unitary filter, a combiner, and an error estimator. The unitary filter may include a feedback portion to generate a feedback output and a feed forward portion to generate a feed forward output. The combiner may combine the feedback output and the feed forward output into a combined output. The error estimator may generate an error signal for the unitary filter based on the combined output.

10 Claims, 3 Drawing Sheets

ADAPTIVE FILTER HAVING SHARED STRUCTURE

BACKGROUND

Implementations of the claimed invention generally may relate to schemes for canceling echoes or reflections and, more particularly, to schemes for canceling echoes using adaptive filters.

When using digital communication techniques in terrestrial communication, fairly sophisticated equalization circuits may be needed to compensate for severe and/or long delayed reflections (e.g., echoes). For single carrier protocols, for example, the equalizer may need to compensate for pre-echoes and/or post-echoes (which may also be called reflections). As used herein, "pre-echoes" may be conceptualized as those signals of interest arriving earlier than an expected/reference time (e.g., due to multipath effects), and "post-echoes" may be conceptualized as those signals of interest arriving later than an expected/reference time (e.g., due to multipath effects). One possible approach for handling such echoes/reflections may be to build an adaptive filter equalizer, with two branches (i.e., feed forward and feedback branches) to compensate for pre-echoes and/or post-echoes.

FIG. 1 illustrates a typical adaptive filter 100 according to such an approach. Filter 100 may include a feed forward branch 110, a combiner 120, an error estimator 130, and a feedback branch 140. Combiner may combine the outputs of branches 110 and 140, and error estimator 130 may produce an estimated error between its output and a desired or ideal output without any echo. This estimated error may be used to adjust the coefficients (e.g., characteristics) of branches 110 and 140 to minimize the error (e.g., to adaptively filter the input signal).

The length of feed forward branch 110 may be based on an expected worst case delay that is associated with a pre-echo. Similarly the length of feedback branch 140 may be based on an expected worst case delay that is associated with a post-echo. The lengths of branches 110 and 140 (and hence their delays) may be different. In this manner, the maximum delays associated with branches 110 and 140 may be sufficient for filter 100 to cancel out the expected, worst case pre-echoes and post-echoes that occur in the input signal.

The fixed lengths of branches 110 and 140, however, may not be amenable to different communication channels, and may not be an optimal use of silicon resources on a device.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed invention. However, it will be apparent to those skilled in the art having the benefit of the present disclosure that the various aspects of the invention claimed may be practiced in other examples that depart from these specific details. In certain instances, descriptions of well known devices, circuits, and methods are omitted so as not to obscure the description of the present invention with unnecessary detail.

Figure 2:
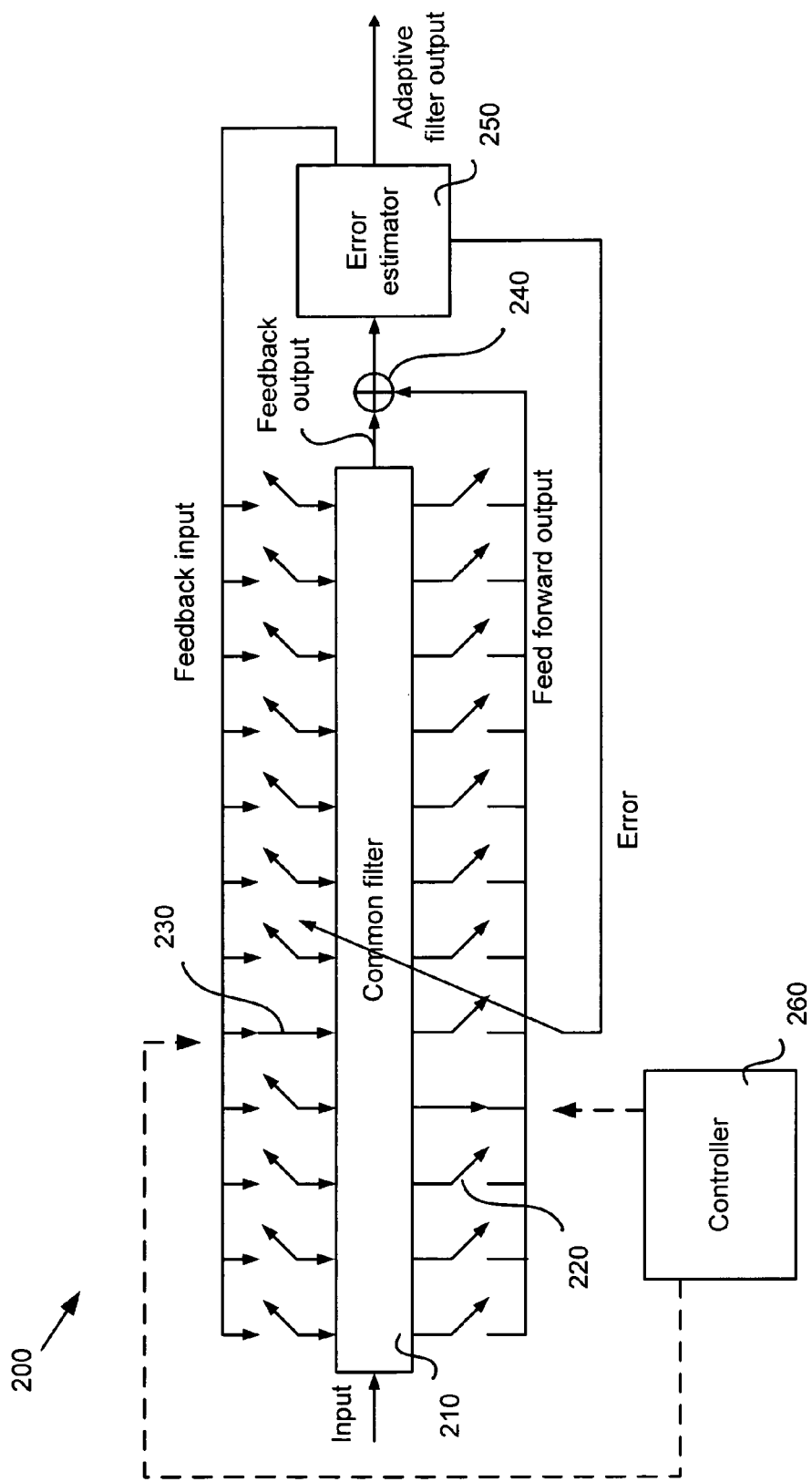
FIG. 2 illustrates an exemplary adaptive filter consistent with the principles of the invention.

FIG. 2 illustrates an exemplary adaptive filter 200 consistent with the principles of the invention. Filter 200 may receive an input signal from any suitable medium, including but not limited to various transmission media. For example, in some implementations adaptive filter 200 may be included in an equalizer and/or digital demodulator. Although illustrated as separate functional elements for ease of explanation, any or all of the elements of adaptive filter 200 may be co-located and/or implemented by a common group of gates and/or transistors. Further, adaptive filter 200 may be implemented via software, firmware, hardware, or any suitable combination thereof.

Adaptive filter 200 may include a common filter 210, first switches 220, second switches 230, a combiner 240, an error estimator 250, and a controller 260. Although illustrated as discrete functional elements, certain ones of elements 210-260 may be jointly implemented. For example, in some implementations one or more of error estimator 250 and/or controller 260 may be implemented by a general-purpose or specific-purpose processor executing software and/or firmware. Other specific implementations for elements 210-260 are both possible and contemplated.

Common filter 210 may include multiple filtering stages along its length that are accessible by multiple taps. These taps may permit inputting signals into and/or outputting signals from different points along filter 210. Common filter 210 may filter according to adjustable coefficients, and may impart up to a total delay that is proportional to its length (e.g., number of stages). Common filter 210 may adjust its coefficients proportionally to the error signal received from error estimator 250.

Common filter 210 may receive an input signal to be filtered at its input end, and may output a feedback output signal to combiner 240 at its output end that is opposite its input end. In some implementations, common filter 210 may output a feed forward output signal at one of its taps via first switch 220, as will be explained in greater detail below. In some implementations, common filter 210 may receive a feedback input signal at one of its taps via second switch 230, as will be explained in greater detail below.

First switch 220 may be arranged to connect any tap of common filter 210 to combiner 240. First switch 220 may include, for example, a digital switch, multiplexer, or any suitable structure to connect a feed forward output signal from common filter 210 to combiner 240. For ease of reference, first switch 220 may connect to the "$n^{th}$" tap of common filter 210, where n is an integer in ranging from one to K, the total number of taps associated with filter 210.

Figure 1:
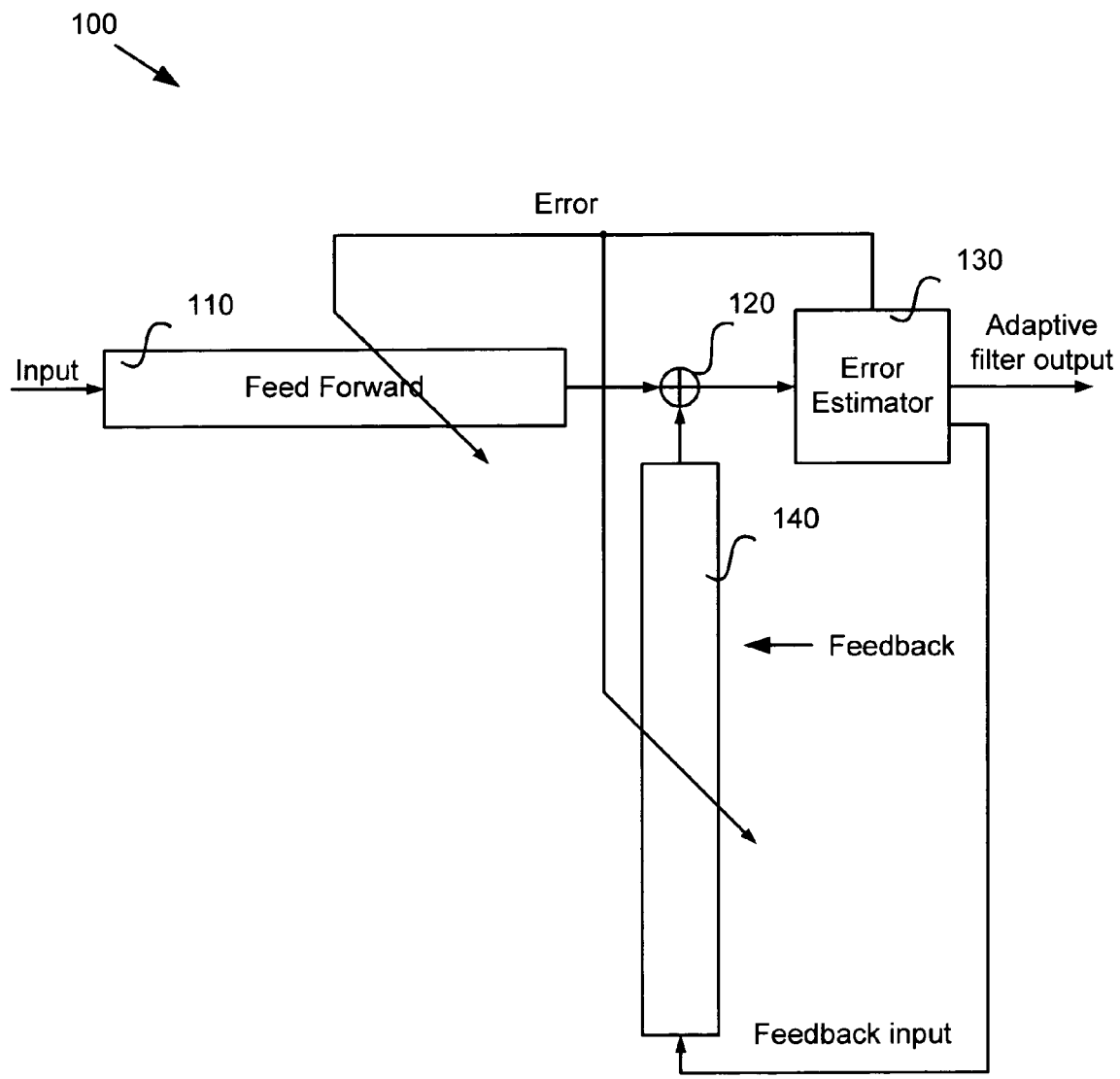
FIG. 1 illustrates a typical adaptive filter.

In this manner, first switch 220 may cause the left-most portion of common filter 210 (i.e., from its input to tap n) to behave as a feed forward filter, like filter 110 shown in FIG. 1. The pre-echo in the input signal that is able to be compensated for by this first portion, defined by first switch 220, of common filter 210 may range from zero to the total delay of filter 210, depending on which tap n first switch 220 connects to. It should be noted, however, that in some implementations, first switch 220 may not connect a tap of common filter 210 to combiner 240, which may effectively remove the feed forward branch of adaptive filter 200.

Second switch 230 may be arranged to connect error estimator 250 to any tap of common filter 210. Second switch 230 may include, for example, a digital switch, multiplexer, or any suitable structure to connect a feedback input signal from estimator 250 to common filter 210. With reference to the earlier description of first switch 220, second switch 230 may connect to the "$(n+1)^{th}$" tap of common filter 210, where the $n^{th}$ tap of filter 210 is connected to by first switch 220. Of course, other tap positions (e.g., n+2, n+3, etc.) are possible for second switch 230 that avoid overlap with the portion of filter 210 used by first switch 220, but an immediately adjacent tap (i.e., the $(n+1)^{th}$ tap) may maximize the delay compensation available to the portion of filter 210 used by second switch 230.

In this manner, second switch 230 may cause the rightmost portion of common filter 210 (i.e., from tap n+1 to its output) to behave as a feedback filter, like filter 140 shown in FIG. 1. The post-echo in the input signal that is able to be compensated for by this second portion, defined by second switch 230, of common filter 210 may range from zero to the total delay of filter 210, depending on which tap n+1 second switch 230 connects to. It should be noted, however, that in some implementations, second switch 230 may not connect estimator 250 to a tap of common filter 210, which may effectively remove the feedback branch of adaptive filter 200.

Because the reference tap n (and also n+1) may be altered by switches 220 and 230, the operating point of common filter 210 may be varied to accommodate different worst-case pre-echoes and post-echoes. Further, the "pooling" of filtering resources in common filter 210 enables either a greater range of pre- and post-delay filtering with the same total filter length (e.g., filter 210 and the sum of filters 110 and 140), the same range of pre- and post-delay filtering with a smaller length for common filter 210 than the sum of filters 110 and 140, or some combination thereof. Thus, in addition to a greater possible range in worst-case echo coverage, adaptive filter 200 may consume less on-die area (and hence less power) in a device (e.g., a demodulator).

Combiner 240 may include logic to arithmetically combine the feedback output from common filter 210 and the feed forward output from first switch 220. In some implementations, combiner 240 may include an analog or digital adder. In some implementations, however, combiner 240 may include a subtracter, depending on how adaptive filter 200 is designed.

Error estimator 250 may estimate a difference (e.g., an error) between an expected or desired value for a equalizer output signal and the actual value from combiner 240. This error value may be used by common filter 210 to alter its coefficients to adaptively reduce the amount of error. Error estimator 250 may estimate such error using any one of a number of now-known or later-developed schemes for doing so, including but not limited to blind estimation, decision directed estimation, or training sequences. For blind estimation, for example, error estimator 250 may use some predetermined criteria (e.g., least mean square values, etc.). Decision-directed estimation may compare the output of adaptive filter 200 to several possible values or outcomes to determine the error. In some implementations, a training sequence may be sent periodically so that the filtering error may be determined with certainty.

Whatever scheme for estimating error, error estimator 250 may output an error signal to common filter 210 for use in adjusting its characteristics (e.g., its filter coefficients) The error signal may enable common filter 210 to cancel out, for example, a range of pre-echoes and/or post-echoes by adjusting its delay characteristics.

Error estimator 250 outputs the feedback input signal to second switch 230. In some implementations, this feedback input signal may include the output of adaptive filter 200. In some implementations, however, this feedback input signal may include a prior output of filter 200. In some implementations (e.g., for blind estimation), error estimator 250 may send no feedback input signal to second switch 230.

Controller 260 may be connected to first switch 220 and second switch 230 to select the point(s) n (and hence n+1) along common filter 210 at which these switches are connected. Although not explicitly shown in FIG. 2, controller 250 may also be connected to one or more of the input of filter 210, the coefficients of filter 210, and/or any output of error estimator 250 to obtain data on which to base its selection of the points n and n+1.

As will be explained in greater detail below, controller 260 may use channel estimation, sensing the coefficients of filter 210, or any other suitable scheme for determining how to set switches 220 and 230. In such a manner, controller 260 may dynamically allocate the delay of common filter 210 between the feedback branch and the feed forward branch of adaptive filter 200 to accommodate various pre-echoes and post-echoes in the input signal. In some implementations, controller 260 may make such a measurement-based adjustment of switches 220 and 230 upon the initial reception of an input signal from a communication channel. In some implementations, controller 260 may make such a measurement-based adjustment of switches 220 and 230 from time to time (e.g., periodically, but not necessarily so), possibly depending on changing channel conditions and/or conditions of filter 210. In some implementations, controller 260 may select lengths of each branch of filter 200 based on some historical data of such a channel.

Figure 3:
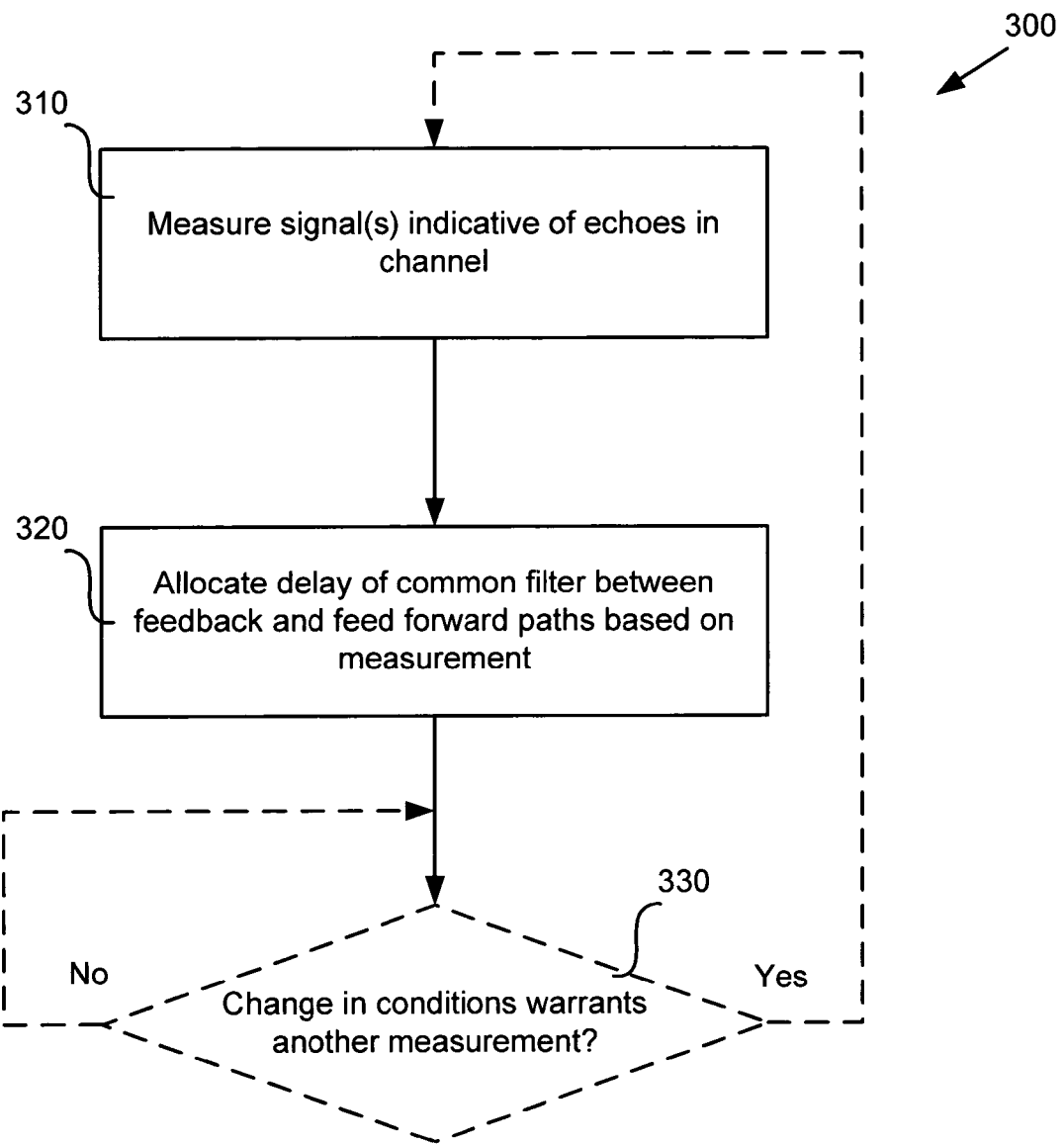
FIG. 3 illustrates an exemplary process of dynamically allocating resources in an equalizer.

FIG. 3 illustrates an example process 300 of dynamically allocating resources in an equalizer. Although FIG. 3 may be described with regard to adaptive filter 200 in FIG. 2 for ease and clarity of explanation, it should be understood that process 300 may be performed by other hardware and/or software implementations.

Processing may begin by controller 260 measuring one or more signals that are indicative of echoes in a communication channel through which the input signal travels [act 310]. In some implementations, act 310 may be performed based on a known pattern in the received signal to filter 210. Purely as one example, in the Advanced Television System Committee (ATSC) technical standard, a received signal may contain a periodic known pattern of length 812 symbols every 24 msec. This "Field Sync" known signal (and/or others like it) has high immunity against noise and/or distortion and may be detected relatively easily by controller 260. With knowledge of the transmitted sequence (e.g., the known pattern), and the received one, controller 260 may estimate the strength of different echoes and their locations (at least the stronger ones).

In some implementations, act 310 may be performed based on the coefficients of common filter 210. Controller 260, for example, may determine the magnitudes (e.g., relative or absolute magnitudes) of the coefficients corresponding to the feedback and feed forward portions of filter 210. Based on such coefficient magnitudes, controller 260 may determine the current (and possibly the past also) pre-echoes and post-echoes being canceled by filter 210. Although such coefficient measuring and "channel estimation" described above may be two exemplary schemes for act 310, any other suitable scheme for determining echoes in the input signal may be employed in act 310.

Processing may begin by controller 260 allocating the total delay of common filter 210 between feedback and feed forward paths based on the measurement in act 310 [act 320]. In act 320, controller 260 may change the lengths of the respective paths via first and second switches 220 and 230. In some implementations, the length of one path (either feedback or feed forward) may be zero.

In some implementations, act 320 may determine how much delay (e.g., length of filter 210) to assign to a particular feedback or feed forward path by the strongest (e.g., highest magnitude) echo. For example, controller 260 may allocate sufficient delay/length to ensure cancellation of the strongest echo, pre or post, and allocate the remainder to the other branch of filter 210. In some implementations, act 320 may allocate excess filter length (e.g., beyond that needed to cancel out measured delays) roughly equally between the feedback and feed forward portions of common filter 210. In some implementations, however, controller 260 may allocate the excess delay in a predetermined, unequal fashion (e.g., 25 or 50 percent more for the feedback path via switch 230). Other schemes for how to apportion common filter 210 are both possible and contemplated.

In some implementations, acts 310 and 320 may be performed once, for example upon initialization of adaptive filter 200 or at the start of receiving the input signal. In some implementations, however, it may be desirable to optionally (hence the dotted lines in FIG. 3) re-apportion common filter 210 between the feedback and feed forward branches. In such implementations, controller 260 may determine whether a change in conditions has occurred that warrants repeating acts 310 and 320 [act 330]. When such a condition occurs, acts 310 and 320 may be optionally repeated.

In some implementations, for example, the change in conditions may be switching to a different communication channel by the demodulator in which adaptive filter 220 resides. In some implementations, for example where the paths are updated from time to time (e.g., periodically, but not necessarily so), the change in conditions in act 330 may be the passage of a predetermined amount of time. Other conditions which may warrant re-allocation of common filter 210 are possible.

The foregoing description of one or more implementations provides illustration and description, but is not intended to be exhaustive or to limit the scope of the invention to the precise form disclosed. Modifications and variations are possible in light of the above teachings or may be acquired from practice of various implementations of the invention.

For example, even though adaptive filter 200 and/or process 300 may be used in the context of digital communication, it is also applicable in any echo cancellation context. Also, although FIG. 2 shows a first portion of filter 210 as the feed forward branch and a second portion of filter 210 as the feedback path, the functions of these two portions may be reversed by a different arrangement of the elements and/or inputs of FIG. 2. Moreover, although not explicitly shown in FIG. 2, adaptive filter 200 may be located within a demodulator (e.g., including a mixer, analog-to-digital converter, decoder, etc.) or other signal processing device (e.g., receiver, tuner, telephony device, etc.) where multipath effects are to be compensated for.

Also, although in some implementations, switches 220 and/or 230 may be connected to every tap of filter 210, in other implementations switches 220 and/or 230 may not be connected to every tap of filter 210. For example, switches 220 and/or 230 may be connected to only every m taps (m being an integer greater than one) of filter 210, based on some desired or otherwise convenient resolution.

Further, at least some of the acts in FIG. 3 may be implemented as instructions, or groups of instructions, implemented in a machine-readable medium.

No element, act, or instruction used in the description of the present application should be construed as critical or essential to the invention unless explicitly described as such. Also, as used herein, the article "a" is intended to include one or more items. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. An apparatus, comprising:
   a common filter to receive a first input signal into a first portion thereof and to output a first output signal from a second portion thereof, the common filter having a plurality of shared filter stages, wherein each shared filter stage can be allocated to either one of the first and second portions;
   a first switch to extract a second output signal from the first portion of the common filter;
   second switch to input a second input signal into the second portion of the common filter; and
   a combiner connected to the first switch and the common filter to combine the first output signal and the second output signal into a combined output signal.

2. The apparatus of claim 1, wherein the first portion and the second portion of the common filter are adjacent.

3. The apparatus of claim 1, wherein the first output signal is a feedback output and wherein the second output signal is a feed forward output.

4. The apparatus of claim 1, further comprising:
   an error estimator to estimate an error in the combined output signal and to provide a corresponding error signal to the common filter.

5. The apparatus of claim 4, wherein the error estimator is also arranged to provide the second input signal to the second switch.

6. The apparatus of claim 1, further comprising:
   a controller to control the first switch and the second switch to control a location of the second output signal along the common filter and a location of the second input signal along the common filter.

7. An adaptive filter, comprising:
   a unitary filter, including:
     a plurality of filter stages,
     a feedback portion to generate a feedback output, and
     a feed forward portion to generate a feed forward output, wherein any one of the filter stages can be allocated to any one of the feedback portion and the feed forward portion;
   a combiner to combine the feedback output and the feed forward output into a combined output;
   an error estimator to generate an error signal for the unitary filter based on the combined output; and
   a feedback selector to select a portion of the filter stages for the feedback portion and to provide a feedback input signal to the feedback portion.

8. The adaptive filter of claim 7, wherein the feedback portion and the feed forward portion of the unitary filter do not overlap.

9. The adaptive filter of claim 7, further comprising:
a controller to select the length of the feed forward portion based on a measured signal.

10. The adaptive filter of claim 7, further comprising:
a feed forward selector to select a portion of the filter stages for the feed forward portion and to provide the feed forward output to the combiner.

* * * * *